United States Patent [19]

Whisenand

[11] Patent Number: 5,367,250
[45] Date of Patent: Nov. 22, 1994

[54] ELECTRICAL TESTER WITH ELECTRICAL ENERGIZABLE TEST PROBE

[76] Inventor: Jeffery E. Whisenand, Pilotystrasse 77, 8500 Nuernberg 10, Germany

[21] Appl. No.: 994,723

[22] Filed: Dec. 22, 1992

[30] Foreign Application Priority Data

Jun. 11, 1992 [DE] Germany .................. 4219079

[51] Int. Cl.$^5$ .................. G01R 31/02; G01R 19/16
[52] U.S. Cl. .................. 324/133; 324/503; 324/72.5
[58] Field of Search .............. 324/133, 503, 555, 556, 324/72, 72.5

[56] References Cited

U.S. PATENT DOCUMENTS 4,027,236  5/1977  Stewart .................. 324/133

FOREIGN PATENT DOCUMENTS 2662257  11/1991  France .................. 324/503

*Primary Examiner*—Walter E. Snow
*Attorney, Agent, or Firm*—William L. Chapin

[57] ABSTRACT

An instrument for performing electrical tests includes a housing adapted to be held in the hand. A conductive probe and a two-conductor power cable adapted to be connected to a vehicle battery protrude from the housing. Red and green light emitting diodes (LED's) mounted in the housing are operatively interconnected with the probe and power cable through circuitry which causes the red LED to glow when the probe contacts a positive voltage, and the green LED to glow when the probe contacts a low voltage, ground, or a negative voltage. Continuity testing may be performed by contacting the probe against one terminal of a device to be tested, and contacting the other terminal of the device to ground or to an auxiliary test lead extending from the housing, causing the green LED to glow. The instrument includes a momentary contact switch that permits the probe to be energized by internal connection to the positive or ground input terminal. Actuating the switch momentarily to energize the probe with a positive voltage causes the green LED to cease glowing and the red LED to glow if the test probe is in contact with a low resistance device, rather than directly to ground, thus providing means to determine whether ground or the supply terminal of a high-current load device has been probed.

16 Claims, 2 Drawing Sheets

ELECTRICAL TESTER WITH ELECTRICAL ENERGIZABLE TEST PROBE

BACKGROUND OF THE INVENTION

A. Field of the Invention

The present invention relates to equipment for testing electrical circuits, more particularly, the invention relates to a portable, hand-held instrument particularly adapted to performing voltage and continuity tests on electrical systems of autos, trucks and similar vehicles.

B. Description of Background Art

Maintenance of the large number of automobiles, trucks and other vehicles on the road has become an increasingly technologically sophisticated task. The requirement for sophisticated test equipment is a result of the increasing complexity of modern vehicles. That complexity in turn has been necessitated by the effort to make vehicles more energy efficient, less polluting, and safer.

Because of the complexity of modern vehicles, a wide variety of sophisticated test equipment has been made available for troubleshooting and adjusting the various systems of vehicles. Much of the test equipment used for vehicle maintenance employs electronic circuitry, which can range from the relatively simple to substantially complex. As might be expected, more complex electronic test equipment tends to be expensive, fragile, and relatively large.

In spite of the complexity of modern vehicle systems, and the test equipment used to service them, much initial trouble shooting performed on the road and, to a lesser extent, at service facilities, often includes relatively simple electrical tests. Such tests typically include resistance and voltage measurements and are often made by use of a volt-ohm-ammeter, or multimeter. However, it is sometimes desirable to perform even simpler electrical diagnostic tests on vehicle systems, such as the presence of voltages, and electrical continuity. Thus, a variety of devices have been designed to perform simple voltage detection and/or continuity measurements for vehicle systems, telephone wiring and the like. The following United States patents related to such electrical test equipment are known to the present inventor.

Garrett. U.S. Pat. No. 3,600,678, Aug. 17, 1971, Solid-State Polarity Tester For Telephone Equipment:

Discloses a solid state polarity tester provided with ground and battery terminals for connection to like contacts of a battery in a telephone central office switchroom, and with a probe to test polarity of telephone equipment, the same embodying two similar circuits between the probe and each respective terminal, each said circuit including an indicator lamp and a transistor that switches on to close the circuit through one lamp according to the direction of current flow, and shorting out the other lamp. The tester includes a third circuit between the probe and the ground terminal and including a glow tube energized to indicate either high-level DC or AC is in contact with the probe.

Naylor, U.S. Pat. No. 3,619,775, Nov. 9, 1971, Polarity And Voltage Level Detecting Test Probe:

Discloses an electrical test instrument for use in servicing digital computers which provides a digital output by means of two lamps indicating the characteristics of a voltage level or pulse or train of pulses at a point in the computer. The instrument comprises a test probe connected through a selectively inserted Zener diode to a pair of cascaded amplifiers each of which drives a gating circuit and a control circuit for providing a conditioning signal to the gates. The gate circuits in turn control the indicating lamps. A pair of flip-flops may be selectively placed in the circuit between the amplifiers and the gates when the test instrument is used to indicate statically the condition of the first pulse received by the probe.

Hall, U.S. Pat. No. 3,806,803, Apr. 23. 1974, Portable Voltage Sampling Probe Device:

Discloses a portable solid state probe device used to sample the voltage for polarity at various points in either telephone central office equipment or outside key equipment. The device itself includes first and second light emitting diodes which will respectively become energized when the sampled voltage is of positive or negative polarity. The device includes Zener regulating diodes to provide a substantially constant voltage to the light emitting diodes so that the device will function properly when supplied with either 48 volts as is available in central office equipment or 24 volts as is only available in field key equipment.

Stewart, U.S. Pat. No. 4,027,236, May 31, 1977, Voltage And Continuity Checker:

Discloses a portable test instrument for testing electrical continuity, and diode polarity, AC and DC voltage amplitudes and DC voltage polarity. An electronic switch device has main electrodes connected in an indicating circuit with an electrical supply, a light-emitting diode and a current-limiting resistor. A double pole, double throw switch is manually switchable between continuity and voltage test positions, and with four resistors defines an input circuit interposed between the control electrode of the electronic switch device and probes connectible to a circuit or the like to be tested. In both the voltage and continuity test modes of the instrument, the light-emitting diode is energized only by current from the electrical supply within the indicating circuit. Though proper circuit operation is obtained by manual manipulation of the mode switch between its voltage and continuity positions, the light-emitting diode is automatically protected from damage should the test probes engage a voltage circuit (within the operating voltage range of the instrument) while the instrument is in continuity mode.

Bloxam, U.S. Pat. No. 4,028,621, Jun. 7, 1977, Portable Automivity Test Probe:

Discloses an improved electronic DC test probe particularly suitable for rapidly and flexibly trouble-shooting automotive electrical systems. The test probe features highly reliable electronic circuits energized from an automotive battery through a pair of connector members suitable for connection to the terminals of the battery. A conductive test prod and a pair of indicator lamps are housed within a hand-held probe housing and enable an operator to rapidly trouble shoot the entire electrical system without alteration of any kind to the battery terminal connections. Electronic reference voltage establishing circuits protect the probe circuits and extend the operative life of the indicator lamps. The normally extinguished indicator lamps are illuminated only during actual test measurements with an intensity that varies proportionately with the measured signal. In one embodiment of the invention a single conductor extends from the probe chassis to a common terminal adjacent the connector members at the battery terminals. Another embodiment includes twin-beam lamps within the probe housing, enabling the probe to double as a trouble light.

Ellis, U.S. Pat. No. 4,366,434, Dec. 28, 1982, Voltage Detectors And Electrical Continuity Checkers:

Discloses a combined voltage detector and electrical continuity checker in the form of a pencil having a needle capable of piercing electrical insulation, a pair of light emitting diodes for determining the polarity of the voltage, a third light emitting diode and associated circuitry to perform a continuity check, a flexible cable and chip which can be plugged into the pencil to perform either one of the tests in conjunction with the needle, and biasing arrangements for the light emitting diodes in order to lower their threshold of conduction.

Nolan, U.S. Pat. No. 4,540,940, Sept. 10, 1985, Circuit Tester For Automotive Electrical Systems:

Discloses a circuit tester for automotive electrical systems comprising a body member of "pistol-grip" configuration having an electrical socket at one end thereof and an electrically conductive probe extending from the other end thereof. An electrical lead is provided for connecting the terminals of the automobile battery to the socket. The lead has a plug at one end thereof which is reversibly receivable by the socket to enable the tester to be placed in either a positive test mode or a negative test mode. A first electrical lead member extends through the body member from the socket to the probe and has a light imposed therein. A second electrical lead extends from the socket to the probe but has a normally open, manually operated switch imposed therein. The second electrical lead member also has a replaceable fuse assembly imposed therein. The light will be illuminated when the switch is closed whether or not the probe is in electrical contact with the electrical system of the automobile or a component thereof. The light will be illuminated when the switch is opened and the probe is in electrical contact with the automobile electrical system or a component thereof when electrical continuity exists. When the switch is closed, electrical current is supplied to the probe.

Cestaro, U.S. Pat. No. 4,599,557, Jul. 8, 1986, Logic Probe:

Discloses a test probe for determining the logic state of a digital logic circuit, which probe utilizes threshold detectors to determine the relative voltage level of a test point, and gate circuits to enable various voltage conditions, e.g., a ground, high, low, uncommitted, or a supply voltage, or a random pulse or a pulse train, to be monitored and the test result indicated on an LED alpha display device. The threshold detectors are selectively settable so that the probe is particularly adapted to test TTL and CMOS circuitry.

Stephens, U.S. Pat. No. 4,999,574, Mar. 12, 1991, Switchable Automotive Circuit Test Light:

Discloses an automotive circuit test light powered by an external power source such as a vehicle battery, and a first light emitting diode for indicating that the device has been connected to a suitable power source. A probe protruding from a housing for the device is connected to a normally closed contact of a first pole of a double-pole, double throw switch and to a normally open contact of a second pole of the switch. The other two transfer contacts of the switch are connected across an external power source. A second LED and series current limiting resistor are connected in series with the first and second poles of the switch. Thus, with the switch in a first position, the second LED will light only when the probe contacts a point at a negative potential with respect to positive terminal of the external voltage source. With the switch in this opposite position, the second LED will light only when the probe contacts a point at a positive potential with respect to the negative terminal of the external voltage source.

The Bloxam patent discloses a pair of lamps connected in series with a test probe. One of the lamps is connected to the cathode of a first diode, while the other is connected to the anode of a second diode. The other terminals of the two diodes are connected to the input terminal of half-wave rectifier, the output terminals of which are connected to the plus and minus terminals of a battery. Thus, the Bloxam device functions as a polarity-sensitive voltage tester.

The Ellis patent discloses inverse parallel LED's and separate D.C. bias voltage sources to test voltage polarity and continuity.

The Stephens patent discloses a automotive circuit tester having a first LED power-on indicator, and a second LED switchable by means of DPDT switch to place the second LED in series with a test probe and either the minus or plus terminal of an external voltage source, thereby providing a polarity indicating voltage tester.

None of the patents described above use a center-off SPDT switch to provide polarity indicating voltage sensing, and polarity selectable continuity testing, and the present inventor is unaware of any other prior art devices having those features. Also, no prior art known to the present inventor discloses or suggests the use of a polarity selectable probe voltage for continuity testing in conjunction with a circuit breaker to permit momentarily contacting a low impedance source or ground to a test point, to determine whether the point is truly at ground or +V, respectively, rather than being connected thereto through a low impedance.

The present invention was conceived of to provide an improved hand-held portable electrical instrument for electrical testing.

OBJECTS OF THE INVENTION

An object of the present invention is to provide a portable test instrument for determining the presence and polarity of voltages, and for determining the continuity of circuits.

Another object of the invention is to provide a polarity sensitive voltage detector, and continuity checker in a hand-holdable housing powered from an external power source.

Another object of the invention is to provide a portable test instrument having a polarity indicating voltage detector, and a polarity selectable continuity checker.

Another object of the invention is to provide a portable test instrument which is adapted to selectably provide a ground or positive voltage to an electrical device such as a fan motor, to determine whether such device is operable.

Another object of the invention is to provide a portable test instrument having a polarity indicating voltage detector, and a polarity selectable continuity detector capable of quickly distinguishing between a direct short and the terminal of a high-current low-impedance device.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, I do not intend that the scope of my exclusive rights and privileges in the invention be limited to details of the embodiments described. I do intend that equivalents, adaptations and modifications of the invention reasonably inferable from the description contained herein be included within the scope of the invention as defined by the appended claims.

SUMMARY OF THE INVENTION

Briefly stated, the present invention comprehends an improved portable instrument especially well suited to testing electrical components and systems of motor vehicles.

The test instrument according to the present invention includes a housing adapted to be held in the hand and having a probe protruding from the housing. In the preferred embodiment, cables protruding from the housing are adapted to be connected to a vehicle battery, for providing electrical power to the instrument. The instrument includes circuitry coupled to the probe and to an indicator device that displays a first type of indication when the probe contacts a conductor that is at a positive voltage above a certain threshold value, and provides a second type of indication when the probe contacts ground or a negative voltage. In the preferred embodiment, a red light emitting diode (LED) is used to indicate a positive voltage, and a green LED is used to indicate ground or a negative voltage.

The instrument according to the present invention includes circuitry for indicating continuity between the probe and either the negative supply lead of the cable, or an auxiliary wire protruding from the housing. Continuity is indicated by illumination of a green LED.

Also included in the test instrument according to the present invention are novel circuit means for indicating whether the probe is in contact with true ground or the positive supply lead of the vehicle-battery, rather than to the terminal of a low impedance device connected thereto. Thus, the instrument includes a center-off, two--active position momentary contact switch and associated circuitry connected to the LEDs, and to the test probe. Activating the switch momentarily in one direction causes a positive voltage to be applied to the probe, causing a green LED indicating continuity to ground to be extinguished, and a red LED to illuminate if the test probe is in contact with the positive terminal of a low resistance load, rather than direct ground. Activating the switch momentarily in the opposite active position causes the negative side of the vehicle battery to be connected directly to the probe, causing a red LED indicating continuity to the positive side of the battery to be extinguished and a green LED to illuminate if the test probe is in contact with the ground terminal of a low resistance load, rather directly to the positive terminal of the vehicle battery- The circuit means just described may also be used to selectably energize a terminal of an electrical device, such as a fan motor, in contact with the probe, with a positive voltage or ground, thus determining whether the device is operable.

DETAILED DESCRIPTION OF THE INVENTION

Figure 1:
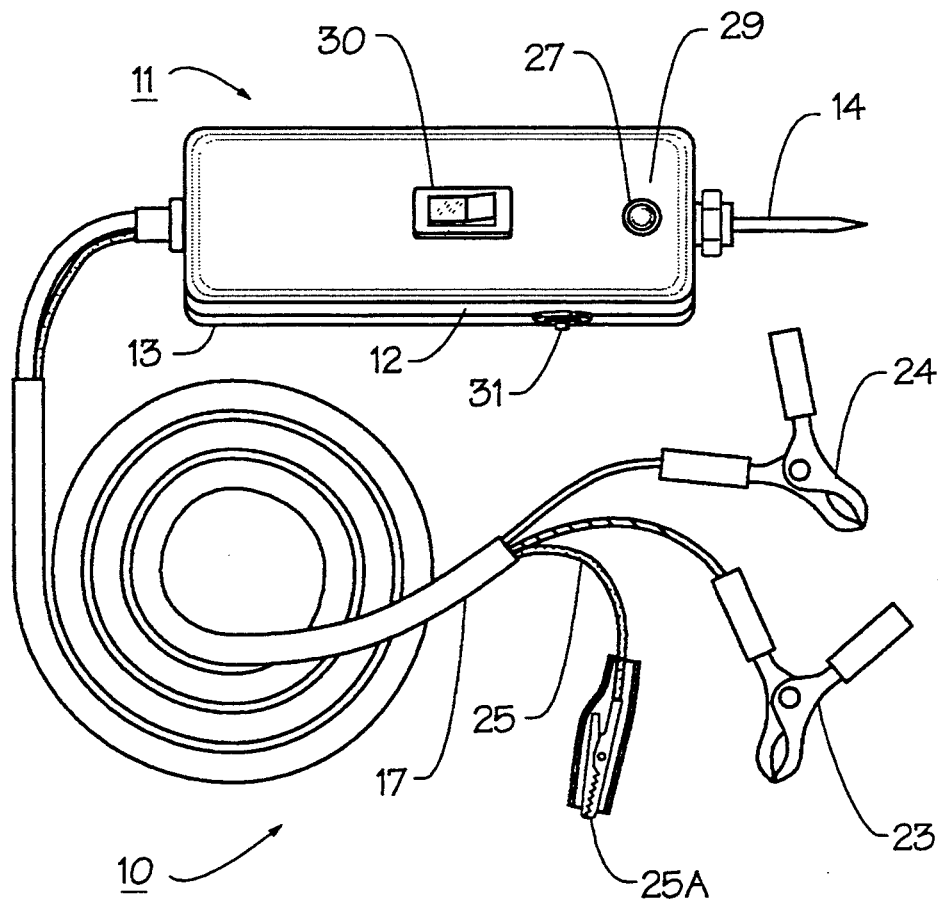
FIG. 1 is a perspective view of an energizable test probe device according to the present invention.
Figure 3:
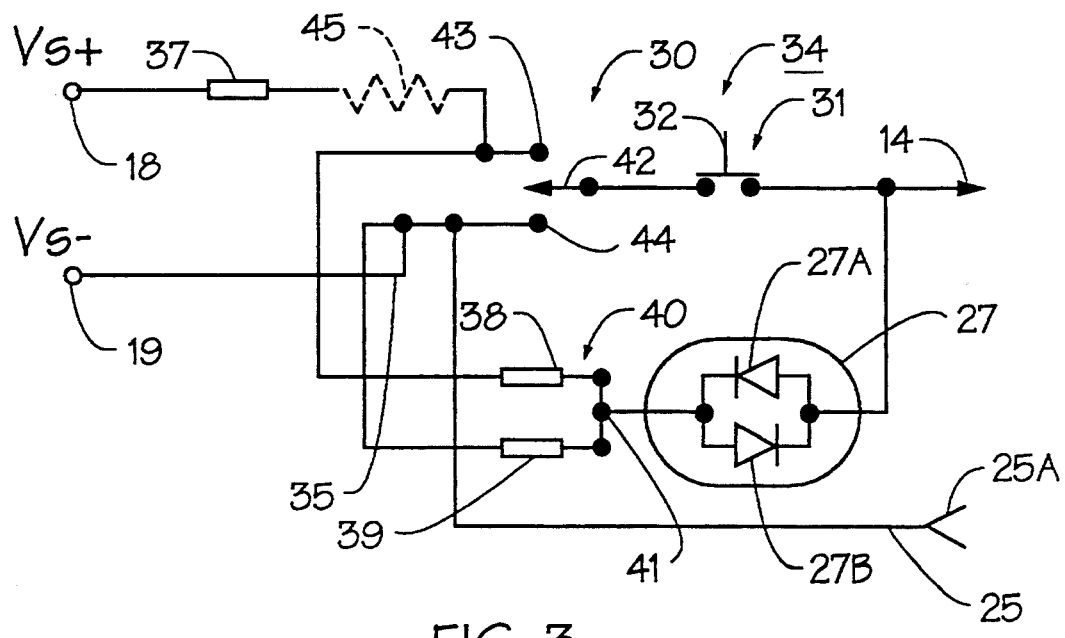
FIG. 3 is a schematic diagram of the device of FIG. 1.
Figure 2:
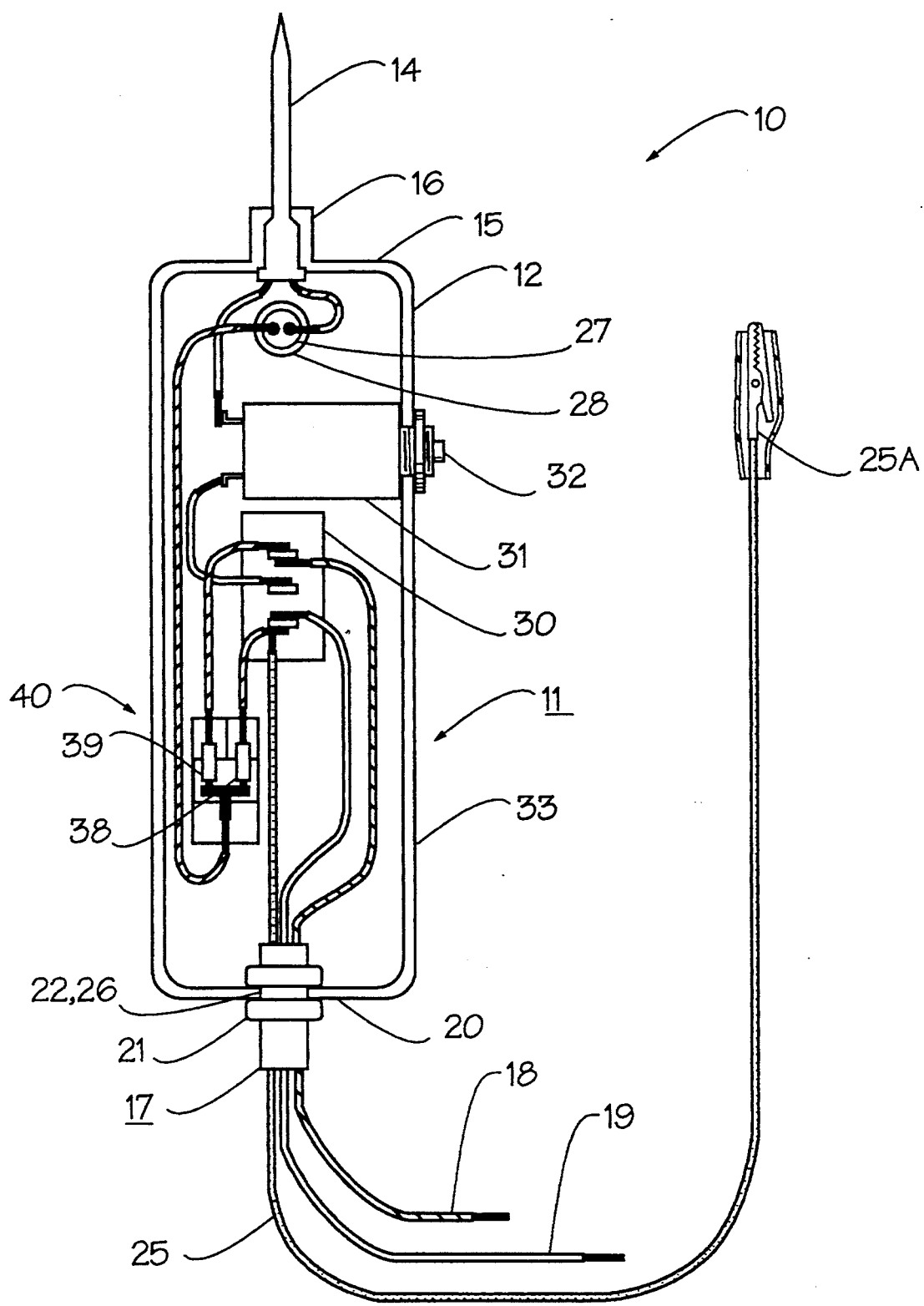
FIG. 2 is a lower longitudinal sectional view of the device of FIG. 1.

Referring now to FIGS. 1 through 3, an electrical test instrument with an energizable test probe according to the present invention is shown.

As may be seen best by referring to FIGS. 1 and 2, the test instrument 10 according to the present invention includes a housing 11 having the external appearance of an elongated, hollow rectangular cross-section box. In the preferred embodiment, housing 11 consists of upper and lower rectangular plan view concave shells 12 and 13, respectively, that are attached together to form the housing. An elongated, sharpened metal probe 14 protrudes through the front, rectangular plan-view and wall 15 of housing 11. Preferably, probe 14 is held coaxially in a circular cross section boss 16 protruding from end wall 15.

A flexible power cable 17 including a positive insulated conductor 18 and a negative insulated conductor 19 protrudes through rear rectangular plan-view end wall 20 of housing 11. Preferably, cable 17 passes through an annular-shaped strain relief bushing or grommet 21 made of resilient material and fitted coaxially into a hole 22 provided through rear end wall 20.

As shown in FIG. 1, the distal ends of insulated conductors 18 and 19 terminate in connectors adapted to be readily attached to and removed from the terminals of a vehicle battery or other power source. In the preferred embodiment, positive conductor 18 terminates in a red-colored alligator clip 23, while negative conductor 19 terminates in a black-colored alligator clip 24. Also, as shown in FIG. 1, test instrument 10 preferably includes an auxiliary negative or ground lead 25 that is used for continuity tests, as will be explained below. Auxiliary test lead 25 is a flexible insulated conductor, preferably terminated at the distal end thereof by a small insulated alligator clip 25A. As shown in FIG. 1, auxiliary test lead 25 protrudes though a hole 26 provided through rear end wall 20 of housing 11. Alternatively, auxiliary test lead 25 could be routed through grommet 21.

Referring still to FIG. 1, test instrument 10 may be seen to include an indicator lamp assembly 27 mounted in a hole 28 provided through upper wall 29 of upper shell 12 of housing 11. Indicator lamp assembly 27 includes two different types of visual indicators. In the preferred embodiment, indicator lamp assembly 27 consists of two inverse parallel light emitting diodes (LED's) 27A and 27B in a single enclosure. One LED, such as 27A is a red-emitting diode, while the other LED, 27B is a green-emitting diode.

As shown in FIG. 1, energizable test probe 10 includes a switch 30 mounted in upper wall 29 of upper shell 12 of housing 11. In the preferred embodiment, switch 30 is a SPDT, momentary contact, center-off rocker switch. Also in the preferred embodiment, energizable test probe 10 includes a circuit breaker 31 having a reset button 32 mounted in a side wall 33 of housing 11.

The operation of energizable test probe instrument 10 may be best understood by referring to FIG. 3.

FIG. 3 is a schematic diagram of circuitry 34 included in energizable test probe 10. As shown in FIG. 3, circuitry 34 includes a common terminal 35 that is in electrically conductive contact with negative conductor 19 of input power cable 17. Circuitry 34 also includes a "high" terminal 36 that is connected to positive conductor 18 of input power cable 17. Those skilled in the art will recognize from the ensuing description of the structure and function of test instrument 10 that the instrument could be readily adapted for use with positive-ground vehicle systems, in which case, common terminal 35 would be connected to a positive ground voltage, and high terminal 36 would be connected to a negative voltage.

As shown in FIG. 3, circuitry 34 optionally includes a fuse 37 connected in series with positive conductor 18 and high terminal 36. A suitable value for fuse 37 is about 30 amps or less. Circuitry 34 includes a resistor R1 (38) having a first terminal connected to high terminal 36. The second terminal of resistor 38 is connected to a first terminal of a resistor R2 (39), the second terminal of the latter resistor being connected to common terminal 35. In the preferred embodiment, resistors 38 and 39 have the same value, e.g., 530 ohms. Thus resistors 38 and 39 comprise a voltage divider 40, the junction or output terminal 41 of which resides at a voltage equal to one-half the voltage VS of a battery to which conductors 18 and 19 may be connected to.

Referring still to FIG. 3, output terminal 41 of voltage divider 40 is connected to the cathode terminal of red LED D1 (27A), and the anode terminal of green LED D2 (27B). The anode terminal of red LED 27A and cathode terminal of green LED 27B are conductively connected to one another, and to probe 14. That portion of circuitry 34 thus far described functions as a polarity indicating voltage sensor, as will now be described.

As was described above, output terminal 41 of voltage divider 40 resides at a voltage of one-half the voltage VS of a vehicle battery to which power cable 17 of the instrument 10 is connected to. Thus, with power cable 17 connected to a 12-volt vehicle battery, output terminal 41 of voltage divider 40 would be at a potential of about +6 volts. Therefore, if probe P1 (14) contacts a conductor of the vehicle electrical system that is at or near the positive battery terminal voltage VS, i.e., +12 volts, red LED 27A is forward biased at a voltage of about (12−6) volts=6 volts, causing indicator 27 to glow with a red light. This indicates that the point being contacted by probe 14 is at a positive voltage of about 7 volts or greater.

In an exactly analogous fashion, if probe 14 contacts a conductor that is in electrical contact with the ground or negative terminal, and at a voltage below about 5 volts, green LED 27B will be illuminated. Thus, LED's 27A and 27B provide a positive polarity voltage indicator for voltages above ½ (VS+1 volt), i.e., for voltages of above 7 volts, and a negative polarity voltage indication for voltages below about 5 volts.

That portion of circuitry described above as functioning as a polarity indicator voltage sensor also may be used to check electrical continuity, as will now be described.

Referring to FIG. 3, if probe 14 and auxiliary lead 25 are connected to the terminals of a device having a resistance of less than about 500 ohms, green LED 27B will light, indicating continuity.

In the preferred embodiment of energizable test probe instrument 10, circuitry 34 includes additional elements in addition to those described above. The additional elements provide a capability for selectably energizing test probe 14 with a positive voltage, or shorting the probe to battery ground, as will now be described.

Referring to FIG. 3, it may be seen that the wiper or transfer contact 42 of SPDT switch S1 (30) is connected to probe 14. As shown in FIG. 3, a circuit breaker CB1 (31) may optionally be included in series with contact 42 and probe 14. One normally open contact A1 (43) of switch 30 is connected to high terminal 36 of circuitry 34. The second normally open contact A2 (44) of switch 30 is connected to common terminal 35 of circuitry 34. Thus, with switch 30 actuated to a first, upper active position from a center-off, non-active position, probe 14 is connected through the switch contacts to high terminal 36 (through circuit breaker 31, if present), and to the positive terminal of a battery to which cable 17 is connected. With switch 30 actuated to a second, lower active position, probe 14 is connected through the switch contacts to common terminal 35, and to the ground terminal of a vehicle battery to which power cable 17 is connected.

Including switch 30 in circuitry 34 as described above allows probe 14 to be connected internally to the positive terminal of a vehicle battery, or "energized," by actuating the switch to a first position. Thus, suppose that continuity of device such as a fan motor has been verified by test instrument 10 with switch 30 in a neutral, off position. As described above, continuity would be verified by placing probe 14 in contact with the plus input terminal of the fan motor, with green LED 27B glowing to indicate continuity. Proper operation of the fan motor could then be verified by actuating switch 30 to its upper, plus, energization position, connecting the positive terminal of the vehicle battery to the fan motor.

By actuating switch 30 to a lower, ground position, probe 14 is connected internally to the battery and vehicle ground. Thus, suppose that the polarity indicating voltage sensing function of instrument 10 were used to verify that a positive battery voltage were present at the plus input terminal of a device, such as a headlamp, yet the device did not function. In that situation, probe 14 would be touched to the ground or return terminal of the device, and switch 30 actuated to its lower, or ground position. If the device then operated normally, it could be concluded that an open ground circuit was responsible for the initial failure of the device to function. Also, if a dim headlight became brighter when ground energization of probe 14 was performed as described above, it could be concluded that a high resistance exists in the ground return circuit of the headlamp. Similarly, actuation of switch 30 to the plus position with probe 14 in contact with the plus terminal of a weakly functioning device such as a dim headlight or slow fan motor can be used to determine if the problem is caused by a high resistance in the supply circuit to the device.

The interaction of switch 30 with other elements of circuitry 34 provides instrument 10 with additional advantageous diagnostic capabilities, as will now be described.

Referring to FIG. 3, suppose that, with switch 30 in its neutral, off position, probe 14 contacts a test point and green LED 27B glows, indicating continuity between the test point and ground. Thus, it may be ascertained that the test point being probed is either connected directly to ground, or through a low impedance to ground. To determine which alternative is correct, switch 30 is actuated to the positive position, connecting probe 14 to the positive terminal of the vehicle battery. If probe 14 is in contact with a point connected to ground through a low resistance, green LED 27B will be extinguished, and red LED 27A will glow. However, if the point being probed is in direct contact with ground, red LED 27A will not be illuminated, indicating that the test point is at true ground. In this eventuality, circuit breaker 31 may trip, but may readily be reset by using reset button 32. In the preferred embodiment, conductors 18 and 19 of power cable 17 have sufficient resistance to limit the peak short-circuit output current from probe 14 to a value of about 30 amperes. Thus, the resistance of conductors 18 and 19 should be about 12 volts/30 amps or about 0.4 ohms. Alternatively, a current-limiting resistor 45 of about 0.4 ohms may be placed in series between positive conductor 18 and high terminal 36. When it is desired to limit the peak short-current from probe 14 to a smaller value, 10 amperes, for example, a circuit breaker 31 having a trip current of that value may be used. Even when a circuit breaker 31 is used, it may be desirable to limit the peak current through the circuit breaker by means of a fuse 37 and/or resistance in series with high terminal 36, to limit the peak current through the circuit breaker to a value small enough to prevent damage to the breaker.

What is claimed is:

1. An instrument for performing electrical tests comprising;
   a. a first power input terminal adapted for connection to the first polarity output terminal of a dc power source,
   b. a second power input terminal adapted for connection to a second output terminal of said dc power source, said second output terminal being of opposite polarity to said first terminal,
   c. a voltage divider having first input terminal connected to said first power input terminal, a second input terminal connected to said second power input terminal, and an output terminal,
   d. a first voltage responsive indicator device responsive to a voltage applied thereto, said indicator device having a first input terminal connected to said output terminal of said voltage divider, and a second input terminal,
   e. a second voltage responsive indicator device having a first input terminal connected to said output terminal of said voltage divider, and a second input terminal,
   f. a conductive probe conductively coupled to said second input terminals of said first and second indicator devices, whererby contacting said probe with an electrical potential different by at least a first threshold voltage from the voltage at the output terminal of said voltage divider causes said first indicator device to provide a first sensible indication, and said second indicator device to provide a second sensible indication when said probe is in electrically conductive contact with an electrical potential different from said output voltage of said voltage divider by at least a second threshold voltage, and
   g. a switch having a transfer contact connected to said probe, a first normally open contact connected to said first power input terminal, and a second normally open contact connected to said second power input terminal, whereby actuating said switch to a first active position causes said probe to be conductively coupled to said first power input terminal, and actuating said switch to a second active position causes said probe to be conductively coupled to said second power input terminal.

2. The instrument of claim 1 further including an auxiliary test lead connected at a proximal end thereof to said power input terminal, said auxiliary test lead being terminated at a distal end thereof by a terminating conductive element adapted to make electrical contact with a first terminal of an electrical device to be tested, whereby contacting a second terminal of said device under test with said probe will cause said second voltage responsive indicator to provide a sensible indication, thereby indicating continuity between said first and second terminals of said device under test.

3. The instrument of claim 1 wherein said first voltage responsive indicator device is further defined as including diode means permitting current to flow from said probe to said first voltage responsive indicator device only in a single, first direction.

4. The instrument of claim 3 wherein said second voltage responsive indicator device is further defined as including diode means permitting current to flow from said probe to said voltage responsive indicator device only in a single, second direction, opposite the direction to which current flow is permitted through said first voltage responsive indicator device.

5. The instrument of claim 4 wherein said first voltage responsive indicator device is further defined as a first light emitting diode.

6. The instrument of claim 5 wherein said second voltage responsive indicator device is further defined as a second light emitting diode connected in inverse parallel with said first light emitting diode.

7. The instrument of claim 6 wherein said second light emitting diode is further defined as having a wavelength of peak emission discernably different from the wavelength of peak emission of said first light emitting diode.

8. The instrument of claim 7 wherein said first and second light emitting diodes are contained in a common package.

9. The instrument of claim 7 wherein said wavelength of peak emission of said first light emitting diode is further defined as being red.

10. The instrument of claim 9 wherein said wavelength of peak emission of said second light emitting diode is further defined as being green.

11. The instrument of claim 1 further including current limiting means in series with said probe.

12. The instrument of claim 11 wherein said current limiting means is further defined as being a resistor.

13. The instrument of claim 11 wherein said current limiting means is further defined as being a circuit breaker.

14. The instrument of claim 11 wherein said current limiting means is further defined as being a fuse.

15. A portable instrument adapted to be held in the hand and used to perform electrical voltage and continuity tests comprising an elongated hollow housing adapted to be held in one hand and containing electrical circuitry used in performing said tests, said housing having protruding therefrom an electrically conductive probe, and protruding therefrom a flexible input power cable, said input cable including a first flexible insulated conductor terminated at a distal end thereof by a first connector adapted to be connected electrically to the first, hot terminal of a vehicle battery, and a second flexible insulated conductor terminated at a distal end thereof by a second connector adapted to be connected electrically to the second, ground terminal of a vehicle battery, said housing having mounted through the wall thereof first and second light emitting diodes operatively interconnected with said probe and said power cable by means of said circuitry within said housing, said circuitry comprising, a. a first, high, power input terminal conductively coupled to said first conductor of said power cable,
b. a second, common, power input terminal conductively coupled to said second conductor of said power cable,
c. a voltage divider having a first input terminal connected to said high input terminal, a second input terminal connected to said common input terminal, and an output terminal,
d. connection means between said output terminal of said voltage divider and the cathode of said first light emitting diode,
e. connection means between said output terminal of said voltage divider and the anode of said second light emitting diode,
f. common connection means between the anode of said first light emitting diode and the cathode of said second light emitting diode, whereby contacting said probe to a conductor at a potential above a first threshold difference above the output voltage of said voltage divider causes said first light emitting diode to emit light, and contacting said probe to a conductor below a first threshold difference below the output voltage of said voltage divider causes said second light emitting diode to emit light, and
g. a momentary contact, neutral center position, single-pole double-throw switch having a first normally open contact connected to said high input terminal, a second normally open contact connected to said common input terminal, and a transfer contact connected to said probe, whereby said probe may be selectably energized with a positive voltage, or a low resistance to said common input terminal.

16. The instrument of claim 15 further including current-limiting means in series with said probe.

* * * * *